United States Patent [19]

Nakamura

[11] Patent Number: 5,066,562

[45] Date of Patent: Nov. 19, 1991

[54] METHOD OF HEATING IMAGE FORMATION SHEET

[75] Inventor: Hiroshi Nakamura, Kanagawa, Japan

[73] Assignee: Fuji Photo Film Co., Ltd., Kanagawa, Japan

[21] Appl. No.: 324,786

[22] Filed: Mar. 17, 1989

[30] Foreign Application Priority Data

Mar. 17, 1988 [JP] Japan .................................. 63-64513

[51] Int. Cl.[5] ........................ G03C 5/00; G03C 11/00; G03F 7/34

[52] U.S. Cl. .................................... 430/203; 430/351; 250/318; 250/319

[58] Field of Search ............... 430/351, 203, 330, 350; 250/318, 319

[56] References Cited

U.S. PATENT DOCUMENTS 4,620,096 10/1986 Takehara et al. .................. 250/319

*Primary Examiner*—Charles L. Bowers, Jr.

*Assistant Examiner*—Kathleen Duda

*Attorney, Agent, or Firm*—Sughrue, Mion, Zinn, Macpeak & Seas

[57] ABSTRACT

A method of heating an image formation sheet of the present invention comprises heating while winding the image formation sheet around the periphery of a drum during heat developing and heat transfer. When the total length of the image formation sheet is greater than the length of a contact portion on the periphery of a drum, the image formation sheet and a sheet on which an image is formed are heated while being conveyed at a constant speed so that the heating time is over a given value. While when the total length of the image formation sheet is less than the length of the contact portion on the periphery of the drum, the image formation sheet is wound around the drum at a speed higher than the constant speed, and is heated for development in a stationary state, and is subsequently separated from the drum at the higher speed than the constant speed.

21 Claims, 1 Drawing Sheet

METHOD OF HEATING IMAGE FORMATION SHEET

BACKGROUND OF THE INVENTION

1. Field of the Invention

The present invention relates to a method of heating image formation sheets, and particularly to a method of heating image formation sheets comprising heat-developing photosensitive material during the heat development of latent images on exposed image formation sheets of different lengths.

2. Description of the Related Art

Image recording devices are known which produce images onto image receiving material. Such image recording devices produce a latent image on a heat developing photosensitive material in the form of an image formation sheet or the like, by exposing it, and develops the image by heating the heat developing photosensitive material. Then, the image recording devices superimpose the heat developing photosensitive material on the image receiving material and press together the photosensitive material and the receiving material. As a result, the image recording devices transfer the image onto the image receiving material.

The heat developing photosensitive material and image receiving material used in this sort of image recording device are cut into given lengths, i.e., sheets (for example, A4 size with a total length of 210 mm, or A3 size with a total length of 420 mm), placed one on the other and then conveyed to a heat developing and transfer part. In this heat developing and transfer part, the two materials are held in a superimposed state while being conveyed for a given time between a heating drum heated to about 90° C. and an endless pressure belt. The heat developing photosensitive material is consequently subjected to heat development, and the image recorded on the heat developing photosensitive material is transferred to the image receiving material.

The heat development of the heat developing photosensitive material which is performed after exposure requires heating for a given time (at least 20 seconds or more). Since, as described above, the heating time is the time it takes for the heat developing photosensitive material (and the image receiving material) to pass through the contact portion (heating portion) on the periphery of the heating drum, the speed at which the heat developing photosensitive material (and the image receiving material) is conveyed is determined on the basis of the length of the portion of contact between the heat developing photosensitive material and the heating drum. When heat developing photosensitive materials (and image receiving materials) have different lengths, therefore, the heating time required for heat development can be secured by conveying the materials while holding them uniformly at the same speed, regardless of the actual lengths of the materials.

Since the heat developing photosensitive material is subjected to heat development while wound around the periphery of the heating drum, the time required for this heat development starts from the moment when the front end of the heat developing photosensitive material is wound around the heating drum and ends when the rear end thereof is separated from the drum. In other words, although the time required for heating the heat developing photosensitive material may be 20 seconds or more, as described above, there is a disadvantage in that a time longer than this is required for completing the heat development.

In this case, since the time required for heating the heat developing photosensitive material is determined, the time required for performing the whole of the heat development cannot be reduced by merely changing the length of the contact portion (portion to be heated) on the periphery of the heating drum or by increasing the speed at which the material is conveyed.

In view of the above-described facts, it is an object of the present invention to provide a method of heating image formation sheets, comprised of heat developing photosensitive material, which is capable of reducing the time required for heat developing images exposed on these image formation sheets while enabling better development results of longer image formation sheets.

SUMMARY OF THE INVENTION

A method of heating image formation sheets in accordance with the present invention comprises heating each of the image formation sheets while it is being conveyed in either one of two ways based on the length of the image formation sheets. On the other hand, when the total length of an image formation sheet is greater than the length of the contact portion on the peripheral surface of a drum, a heating time in excess of a given value required for proper development is obtained by conveying the image sheets at a first conveying speed which is maintained constant, determined on the basis of the length of the region of contact between the contact portion on the peripheral surface of the drum and the image sheets, so as to keep the image sheets in the developing contact region for a time period exceeding the given length of developing time required.

On the other hand, when the total length of an image formation sheet is less than the length of the contact portion on the periphery of the drum, the image formation sheet is wound around said drum at a second speed higher than the first constant speed used in the former case, and when the sheet has been fully wound onto the drum, it is caused to assume stationary sheet on the surface of said drum, the heat development in a stationary state, and subsequently, when the development is complete, the sheet is separated from the drum at the same speed at which it was wound thereon, higher than the constant speed used in the former case. In this way same, the heat at which it was wound thereon, development can be completed in the minimum time required for heating the image formation sheet, resulting in a reduction in the overall processing time.

An image recording device to which the present invention is applied may comprise a heat developing part for heat developing a heat developing photosensitive material which has been exposed to light, and a transfer part for transferring an image to an image receiving material by heating the photosensitive material that has been heat developed and superposed on the image receiving material, these two parts of the device being separately provided. Alternatively, these two parts may be provided in the form of one unit, i.e., the device may comprise a heat developing transfer part for simultaneously heat-developing and heat-transferring the heat developing photosensitive material that has been exposed and the image receiving material by heating them while they are superimposed on each other.

The image recording device to which the present invention is applied can also make use of the heat developing photosensitive materials (heat developing photosensitive elements) and image receiving materials (dye fixed elements) which are described in, for example, U.S. Pat. Nos. 4,430,415, 4,483,914, 4,500,626 and 4,503,137; and Japanese Patent Laid-Open Nos. 154445/1984, 165054/1984, 180548/1984, 218443/1984, 120356/1985, 88256/1986, 238056/1986. 169585/1985 and 244873/1985.

DETAILED DESCRIPTION OF EMBODIMENT

Figure 1:
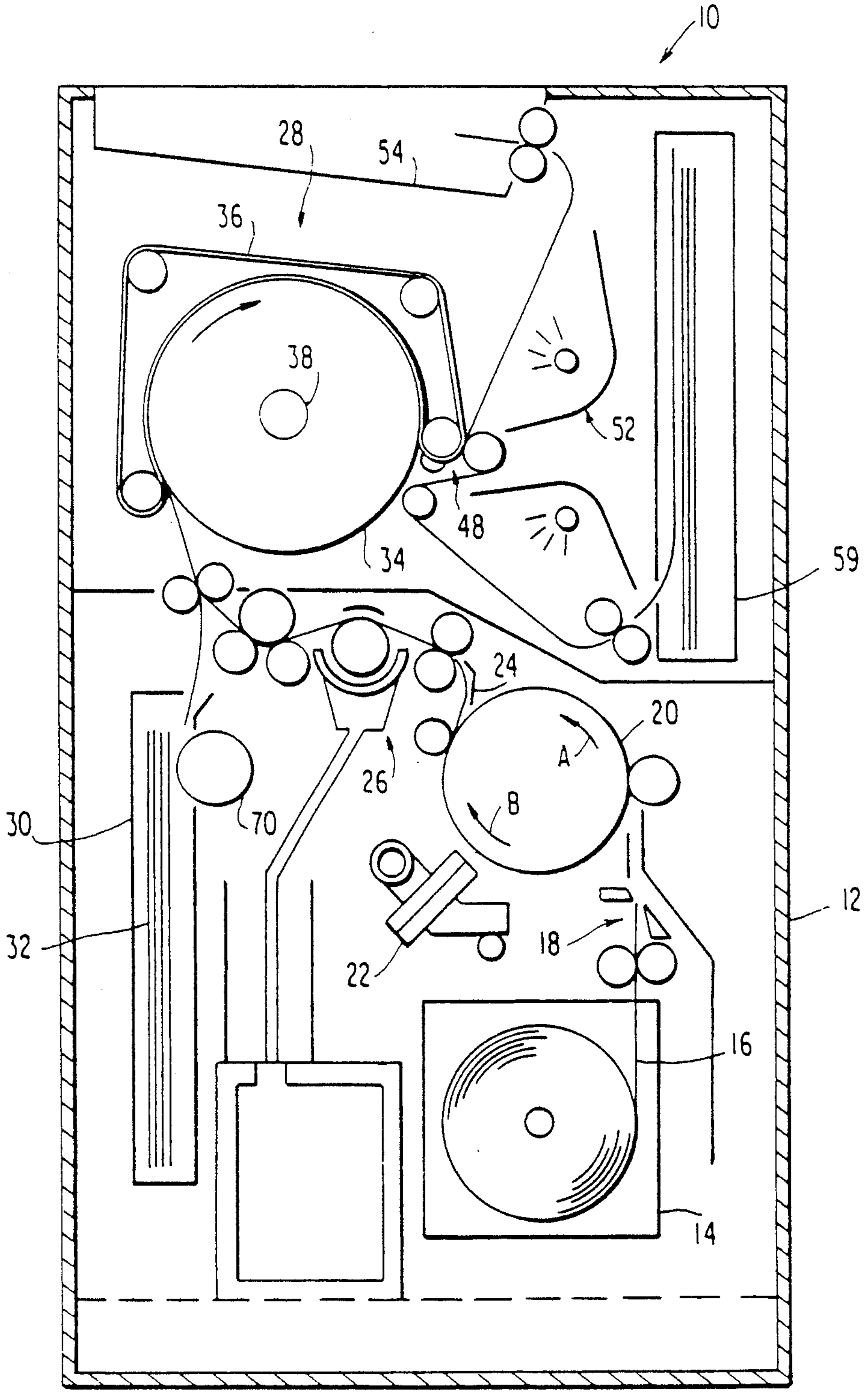
FIG. 1 is a schematic sectional view of an image recording apparatus to which a method of heating image formation sheets in accordance with the present invention is applied.

An embodiment of the present invention is described below.

In an image recording device 10, roll-shaped photosensitive material 16 serving as an image formation sheet is situated in a magazine 14 situated in a machine base 12. The photosensitive material 16 is pulled out from the periphery thereof, cut to a given length by means of a cutter 18 and then wound around the periphery of a rotary drum 20 in the direction shown by the arrow A. An exposure head 22 is disposed so as to correspond to the periphery of the rotary drum 20, and to an image to be exposed on the photosensitive material 16 that is wound around the drum 20 and the rotary drum 20 is made to rotate in the direction shown by the arrow B.

The photosensitive material 16 is separated from the rotary drum 20 following exposure by means of a scraper 24 with the aid of the rotation of the rotary drum 20 in the reverse direction. After water which acts as an image formation solvent has been applied to the photosensitive material 16 in a water application part 26, the material 16 is conveyed to a heat developing and transfer part 28 containing a heating part.

The heat developing and transfer part 28 comprises a heating drum 34 and an endless pressure belt 36, a halogen lamp 38 being disposed in the heating drum 34. In this embodiment, the heating drum 34 is so formed as to have an outer diameter of 140 mm, so that the photosensitive material 16 is subjected to heat development by being conveyed while held between the heating drum 34 and the endless pressure belt 36 over a length of about $\frac{2}{3}$ (240 mm) of the peripheral surfaces of the heating drum 34. The heating drum 34 is heated to about 90° C. by the halogen lamp 38.

A plurality of sheets of image receiving material 32 which are uniformly cut to a given size (for example, A4 size with a total length of 210 mm, or A3 size with a total length of 420 mm) are received in a tray 30 which is disposed below the heat developing and transfer part 28. A developing agent is applied to the image formation surface of the image receiving material 32, and a plurality of sheets thereof are in turn extracted from the tray 30 by a feed roller 70 disposed on the side of the tray and then conveyed to the heat developing transfer part 28 in the state wherein each sheet of image receiving material is superimposed on the photosensitive material 16.

The photosensitive material 16 is subjected to heat development and transfer in the heat developing and transfer part 28 in the state wherein the materials 16 and 32 are placed one on top of the other. During this processing, the image formation substance is transferred to the image receiving material 32 and reacts with the developing agent applied to the image formation surface of the image receiving material 32 to produce an image.

When the total length of a sheet of the image receiving material 32 is greater than the length of the contact portion on the periphery of the heating drum 34 (for example, in the case of A3 size with a total length of 420 mm), the photosensitive material 16 and the image receiving material 32 are subjected to heat-transfer while being conveyed at a speed of 12 mm/second so that the heating time is over a given value (20 seconds) on the basis of the length of the region of contact between the contact portion on the periphery of the heating drum 34 and the image sheets.

When the total length of a sheet of the image receiving material 32 is less than the length of the contact portion on the periphery of the heating drum 34 (for example, in the case of A4 size with a total length of 210 mm), the photosensitive material 16 and the image receiving material 32 are wound around the heating drum 34 at a high speed of 100 mm/second, then they are caused to assume a stationary state on the surface of said drum, and they continue to be heated for about 15 seconds in a stationary state, after which they are separated from the heating drum 34 at the same high speed of 100 mm/second. The total heating period commences at the start of winding around the heating drum 34, and ends upon the separation therefrom and comprises 20 seconds. In this case, therefore, the heat development of the photosensitive material 16 and the image receiving material 32 is carried out over the time (20 seconds) which is the minimum time required for heating.

A separation means 48 is disposed on the side of the heat developing and transfer part 28 so as to separate the photosensitive material 26 from the sheets of image receiving material 32 which are sent from the heat developing and transfer part 28 and to feed each of the two separated material to their respective next stages. The photosensitive material 16 separated is sent to a waste photosensitive material receiving box 59, and the image receiving material 32 separated is dried in a drying apparatus 52 and then placed onto a takeoff tray 54 which is formed on the top of the machine base 12.

A description will now be given of the function of this embodiment.

When the photosensitive material 16 extracted from the magazine 14 is cut by the cutter 18 and is then wound around the periphery of the rotary drum 20, the rotary drum 20 is rotated at a high speed, and an image is exposed thereon by the exposure head 22.

After exposure, the photosensitive material 16 is separated from the rotary drum 20 by the scraper 24 and is then conveyed to the heat developing and transfer part 28 after water has been applied thereto in the water application part 26.

A plurality of sheets of the image receiving material 32 in the tray 30 are extracted in turn therefrom by the feed roller 70 and then sent into the heat developing and transfer part 28 in the state wherein each sheet of the image receiving material 32 is pressed against the photosensitive material 16.

In the heat developing and transfer part 28, the photosensitive material 16 and the image receiving material 32 are subjected to heat development by being conveyed while being held between the heating drum 34 heated to about 90° C. and the endless pressure belt 36 over the length of about $\frac{2}{3}$ the periphery of the heating drum 34. At the same time, the image recorded on the photosensitive material 16 is transferred to the image receiving material 32 as a result of the reaction between the developing agent applied to the image formation surface of the image receiving material 32 and the color image formation substance transferred from the photosensitive material 16.

When the total length of each sheet of the image receiving material 32 is greater than the length of the contact portion on the periphery of the heating drum 34 (i.e., in the case of A3 size with a total length of 420 mm), the photosensitive material 16 and the image receiving material 32 are subjected to heat transfer while being conveyed at a speed of 12 mm/second. The heat developing and transfer processing are therefore completed in 55 seconds.

While when the total length of each sheet of the image receiving material 32 is less than the length of the contact portion on the periphery of the heating drum 34 (i.e., in the case of A4 size with a total length of 210 mm), the photosensitive material 16 and the image receiving material 32 are wound around the heating drum 34 at a high speed of 100 mm/second, heated for about 15 seconds in a stationary state, and are then separated from the heating drum 34 at a high speed of 100 mm/second. In this case, since the winding and the separation of the photosensitive material 16 and the image receiving material 32 require only 5 seconds, the heat development is completed in the minimum time (20 seconds) required for heating from the start of winding around the heating drum 34 to the separation therefrom. (In this case, if the photosensitive material 16 and the image receiving materials 32 were subjected to heat developing and transfer processing while being conveyed at the speed (12 mm/second) that is employed when the total length of each sheet of the image receiving material 32 is greater than the length of the contact portion on the periphery of the heating drum 34, the completion of the processing would require 40 seconds.) Thus, the time required for the processing in this embodiment is significantly reduced.

In this way, when the total length of the superimposed photosensitive material and image receiving material 32 is less than the length of the contact portion on the peripheral surface of the heating drum 34, the heat development can be completed in the minimum time (20 seconds) required for heating.

After the transfer has been completed, the photosensitive material 16 and the image receiving material 32 are separated from each other by the separation means 48, the photosensitive material 16 being sent to the waste photosensitive material receiving box 59 and the image receiving material 32 being sent to the takeoff tray 54 through the drying apparatus 52.

As described above, the method for heating image formation sheets for heat development in accordance with the present invention is a heating method for heating, image formation sheets by heating them while winding them around the periphery of a drum. When the total length of each image formation sheet is greater than the length of the contact portion on the periphery of the drum, the sheet is heated while being conveyed at a constant speed so that the heating time is over a given value. When the total length of each image formation sheet is less than the length of the contact portion on the periphery of the drum, the image formation sheet is wound around the drum at a second speed higher than the constant speed mentioned above, heated for development in a stationary state, and is subsequently separated from the drum at the same speed as it was wound on. When a latent image on an exposed image formation sheet comprised of heat developing photosensitive material is heat-developed, therefore, the heating method of the present invention produces excellent effects in that the duration of contact with the drum is the same over the whole surface of the sheet of material, and thus final images output with a uniform concentration can be obtained and in that the duration required for heat development can be reduced.

What is claimed is:

1. A method of heating an image formation sheet during heat development of said image formation sheet using a drum having a peripheral surface, a length of which is a contact portions comprising the steps of:

producing a latent image on said image formation sheet by exposing said sheet; and heating and developing said image formation sheet on which said image is exposed, wherein when the total length of said image formation sheet is greater than the length of said contact portion on the periphery of the drum, said image formation sheet is heated while being continuously conveyed onto, conveyed across and conveyed from said contact portion at a first sped which is maintained constant so that the heating time required for development for the entire sheet is more than a given value, and when said total length of said image formation sheet is less than said length of said contact portion on said periphery of said drum, said image formation sheet is wound around the periphery of said drum at a second speed higher than the first constant speed and caused to assume a stationary state on the surface of said drum, and the heat development is carried out in said stationary state, and the sheet is subsequently separated from said drum at the speed higher than the constant speed.

2. A method of heating an image formation sheet according to claim 1 further comprising steps of:

superimposing said image formation sheet which was subject to said exposing on a sheet on which an image is to be formed, conveying said superimposed sheets, pressing said superimposed sheets together while they are either in a continuously conveyed state or in a stationary state, and heating said superimposed sheets so as to transfer said image to said sheet on which an image is to be formed.

3. A method of heating an image formation sheet according to claim 2, wherein the step of pressing said two sheets and the step of heating for image transfer between said two sheets are performed while conveying said two sheets between said drum and a long endless pressure member which is provided in contact with said contact portion of said drum.

4. A method of heating an image formation sheet according to claim 2, wherein said development step and said transfer step are performed by heating using a heating means provided in said drum.

5. A method of heating an image formation sheet according to claim 1 further comprising supplying said sheet on which an image is formed onto said drum.

6. A method of heating an image formation sheet according to claim 5, wherein the supplying step comprises extracting said sheet on which an image is formed from a tray for receiving said sheet using a roller, and sending said extracted sheet to a superimposing part for superimposing said sheet on said image formation sheet.

7. A method of heating an image formation sheet according to claim 1 further comprising a step of separating said image formation sheet from said sheet on which an image is formed following delivery of said sheets from the step of heat developing and transferring.

8. A method of heating an image formation sheet according to claim 7 further comprising a step of drying said sheet on which an image is formed.

9. A method of heating an image formation sheet according to claim 8, wherein said exposure is performed by winding said image formation sheet around said drum and moving said sheet past an exposure head while rotating a rotary drum.

10. A method of heating an image formation sheet according to claim 9 further comprising a step of applying water to said image formation sheet exposed to light.

11. A method of heating an image formation sheet according to claim 10, wherein said image formation sheet is made of a photosensitive material and said sheet on which an image is formed is made of an image receiving material.

12. A method of heating an image formation sheet during heat development of said image formation sheet using a drum having a peripheral surface, a length of which is a contact portion, comprising the steps of:

exposing an image on said image formation sheet;

superimposing said image formation sheet on a sheet on which an image is formed to create a superimposed sheet pair;

conveying said superposed sheet pair to a developing transfer location; and developing said image formation sheet, as well as transferring said image to said sheet on which an image is formed, by heating and pressing said two sheets conveyed, wherein when the total length of said superimposed sheet pair is greater than the length of said contact portion on the periphery of the drum in said developing transfer location, said superimposed sheet pair is heated while being continuously conveyed at a first speed which is maintained constant so that the heating time required for developing and transfer is more than a given value, and when said total length of said superimposed sheet pair is less than said length of said contact portion in said periphery of said drum, said superimposed sheet pair is wound around the periphery of said drum at a second speed higher than said first constant speed, and said heat development step is carried out in the stationary state, and said superimposed sheet pair is subsequently separated from said drum at the speed higher than the constant speed.

13. A method of heating an image formation sheet according to claim 12, wherein the step of applying pressure to said sheet pair and the step of transferring said sheet pair are performed by conveying said sheet pair between said drum and a long endless pressure member provided in contact with said contact portion of said drum.

14. A method of heating an image formation sheet according to claim 12, wherein said development steps and said transfer step are performed by heating using a heating means provided in said drum.

15. A method of heating an image formation sheet according to claim 12 further comprising a step of supplying said sheet on which an image is formed onto said drum.

16. A method of heating an image formation sheet according to claim 15, wherein said step of supplying is performed by extracting said sheet on which an image is formed from a receiving tray using a roller, and by sending said sheet to a superimposing location for superimposing it on said image formation sheet.

17. A method of heating an image formation sheet according to claim 12 further comprising a step of separating said image formation sheet and said sheet on which an image is formed following said steps of heat developing and transferring.

18. A method of heating an image formation sheet according to claim 17 further comprising a step of drying said separated sheet on which an image is formed.

19. A method of heating an image formation sheet according to claim 18, wherein said exposure is performed by winding said image formation sheet around a rotary drum and moving said sheet past an exposure head while rotating said rotary drum.

20. A method of heating an image formation sheet according to claim 19 further comprising a step of applying water to said exposed image formation sheet.

21. A method of heating an image formation sheet according to claim 20, wherein said image formation sheet is made of a photosensitive material and said sheet on which an image is formed is made of an image receiving material.

* * * * *